US006359482B1

(12) United States Patent
Miller, Jr. et al.

(10) Patent No.: US 6,359,482 B1
(45) Date of Patent: Mar. 19, 2002

(54) METHOD AND APPARATUS FOR DIGITAL DELAY LOCKED LOOP CIRCUITS

(75) Inventors: James E. Miller, Jr.; Aaron Schoenfeld, both of Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/650,720

(22) Filed: Aug. 30, 2000

Related U.S. Application Data (62) Division of application No. 09/110,179, filed on Jul. 6, 1998, now Pat. No. 6,137,334.

(51) Int. Cl.[7] .................................................. H03L 7/06
(52) U.S. Cl. .................... 327/156; 327/147; 327/161; 327/271; 375/376; 331/DIG. 2; 331/1 A
(58) Field of Search .......................... 327/141, 147, 327/149, 150, 152, 153, 155, 156, 158, 159, 161, 269–271, 276, 182, 183; 371/371–376; 331/DIG. 2, 1 A, 25; 365/233, 233.5, 194

(56) References Cited

U.S. PATENT DOCUMENTS

| 4,458,165 A | | 7/1984 | Jackson ........................ 365/233 |
| 5,118,975 A | | 6/1992 | Hillis et al. ................... 327/158 |
| 5,287,025 A | * | 2/1994 | Nishimichi ................... 327/156 |
| 5,463,337 A | | 10/1995 | Leonowich .................. 327/158 |
| 5,663,665 A | | 9/1997 | Wang et al. ..................... 327/3 |
| 5,684,421 A | | 11/1997 | Chapman et al. ............ 524/789 |
| 5,717,353 A | | 2/1998 | Fujimoto ...................... 327/276 |
| 5,744,991 A | | 4/1998 | Jefferson et al. ............. 327/158 |
| 5,875,219 A | * | 2/1999 | Kim .............................. 375/376 |
| 5,946,268 A | | 8/1999 | Iwamoto et al. ............. 327/276 |
| 6,100,736 A | * | 8/2000 | Wu et al. ..................... 327/159 |

OTHER PUBLICATIONS

Hatakeyama et al., "A 256–Mb SDRAM Using a Register –Controlled Digital DLL," IEEE Journal of Solid–State Circuits, vol. 32, No. 11, Nov. 1997, pp. 1728–1732.

Eto et al., "A 1Gb SDRAM with Ground Level Precharged Bitline and Non–Boosted 2.1V Word Line," ISSCC Digest of Technical Papers, pp. 82–83, Feb. 1998.

* cited by examiner

Primary Examiner—Kenneth B. Wells
Assistant Examiner—Minh Nguyen
(74) Attorney, Agent, or Firm—Dickstein Shapiro Morin & Oshinsky LLP (57) ABSTRACT

A method and apparatus for improving a delay line circuit of a Digital Delay Lock Loop (DDLL) circuit. Each delay stage of the delay line consists of three gates, two NANDs and one inverter. The reduction in the total number of gates decreases the unit delay time for each stage, improving the resolution of each stage of the delay line. In addition, the reduction in the total number of gates in each stage significantly reduces the amount of space necessary for the circuitry of the delay line, resulting in an overall decrease in the size of the DDLL circuit.

22 Claims, 9 Drawing Sheets

PRIOR ART

METHOD AND APPARATUS FOR DIGITAL DELAY LOCKED LOOP CIRCUITS

This application is a divisional application of U.S. patent application Ser. No. 09/110,179 filed Jul. 6, 1998, now U.S. Pat. No. 6,137,334, the entirety of which is incorporated herein by reference.

BACKGROUND OF THE INVENTION

1. Field of the Invention

The present invention relates to circuitry for generation of periodic signals such as dock signals. More specifically, the present invention relates to a delay line circuit for register controlled digital delay locked loop (DDLL) circuits which use fewer gates and have improved performance.

2. Description of the Related Art

Many high speed electronic systems possess critical timing requirements which dictate the need to generate a periodic clock wave form that possesses a precise time relationship with respect to some reference signal. The improved performance of computing integrated circuits (ICs) and the growing trend to include several computing devices on the same board present a challenge with respect to synchronizing the time frames of all the components.

While the operation of all components in the system should be highly synchronized, i.e., the maximum skew or difference in time between the significant edges of the internally generated clocks of all the components should be minute, it is not enough to feed the reference clock of the system to all the components. This is because different chips may have different manufacturing parameters which, when taken together with additional factors such as ambient temperature, voltage, and processing variations, may lead to large differences in the phases of the respective chip generated clocks.

Conventionally, synchronization is achieved by using DDLL circuits to detect the phase difference between clock signals of the same frequency and produce a digital signal related to the phase difference. By feeding back the phase difference-related signal to control a delay line, the timing of one clock signal is advanced or delayed until its rising edge is coincident with the rising edge of a second clock signal.

Figure 1:
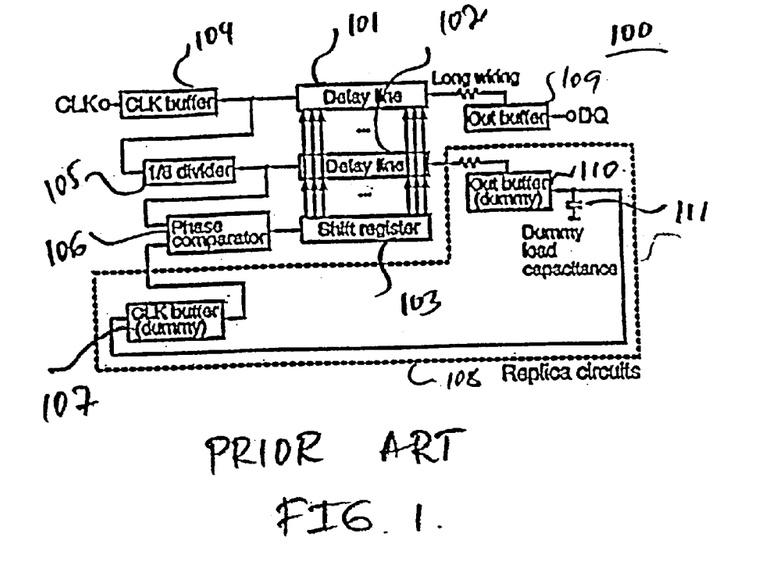
FIG. 1 illustrates in block diagram form a known digital delayed lock loop (DDLL) circuit.
Figure 2A:
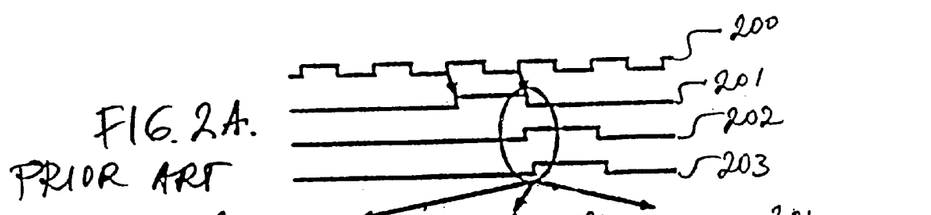
FIG. 2A illustrates a timing diagram showing the operation of the DDLL of FIG. 1.
Figures 2B, 2C, 2D:
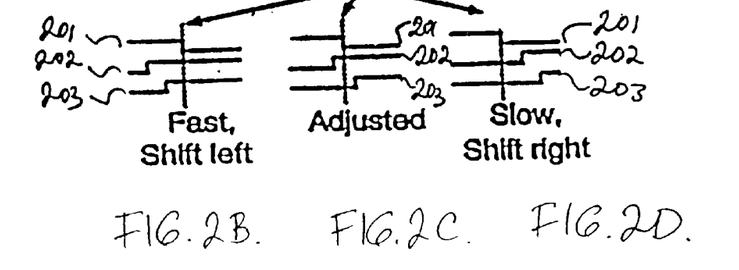
FIG. 2B illustrates a timing diagram showing a faster internal signal than the external signal.
FIG. 2C illustrates a timing diagram showing adjusted internal and external signals.
FIG. 2D illustrates a timing diagram showing a slower internal signal than the external signal.

The operation of conventional DDLLs is shown in FIGS. 1 and 2. In FIG. 1, clock input buffer 104, delay lines 101, 102, and data output buffer 109 constitute an internal clock path. Delay line 101 is a variable delay generator with a logic-gate chain. A second delay line 102 is connected to replica circuits 108, which emulate the internal clock path components. Replica circuits 108 include dummy output buffer 110, with dummy load capacitance 111 and dummy clock buffer 107. The dummy components and second delay line 102 constitute a dummy clock path having exactly the same delay time as the internal clock path. Shift register 103 is used for activating a number of delay elements in both delay lines based on a command generated by phase comparator 106.

Phase comparator 106 compares the dummy clock and the external clock phases which differ by one cycle. This comparison is illustrated in FIGS. 2A, 2B, 2C, and 2D. External dock signal 200 is divided down in divider 105 to produce divided-down external signal 201. Signal 202 is the signal at the output of dummy delay line 102. Signal 203, which is generated inside phase comparator 106, is a one delay unit delayed output dummy line signal 202. If both signals 202 and 203 go high before 201 goes low, this means that the output clock is too fast and phase comparator 106 outputs a shift left (SL) command to shift register 103, as illustrated in FIG. 2B. Shift register 103 shifts the tap point of delay lines 102 and 101 by one step to the left, increasing the delay. Conversely, if both signals 202 and 203 go high after 201 goes low, this means that the output clock is too slow and phase comparator 106 outputs a shift right (SR) command to shift register 103, as illustrated in FIG. 2D. Shift register 103 shifts the tap point of delay lines 102 and 101 by one step to the right, decreasing the delay. If 201 goes low between the time 202 and 203 go high, the internal cycle time is properly adjusted and no shift command is generated, as illustrated in FIG. 2C. The output of the internal clock path in this case coincides with the rising edge of the external clock and is independent of external factors such as ambient temperature and processing parameters.

Figure 3:
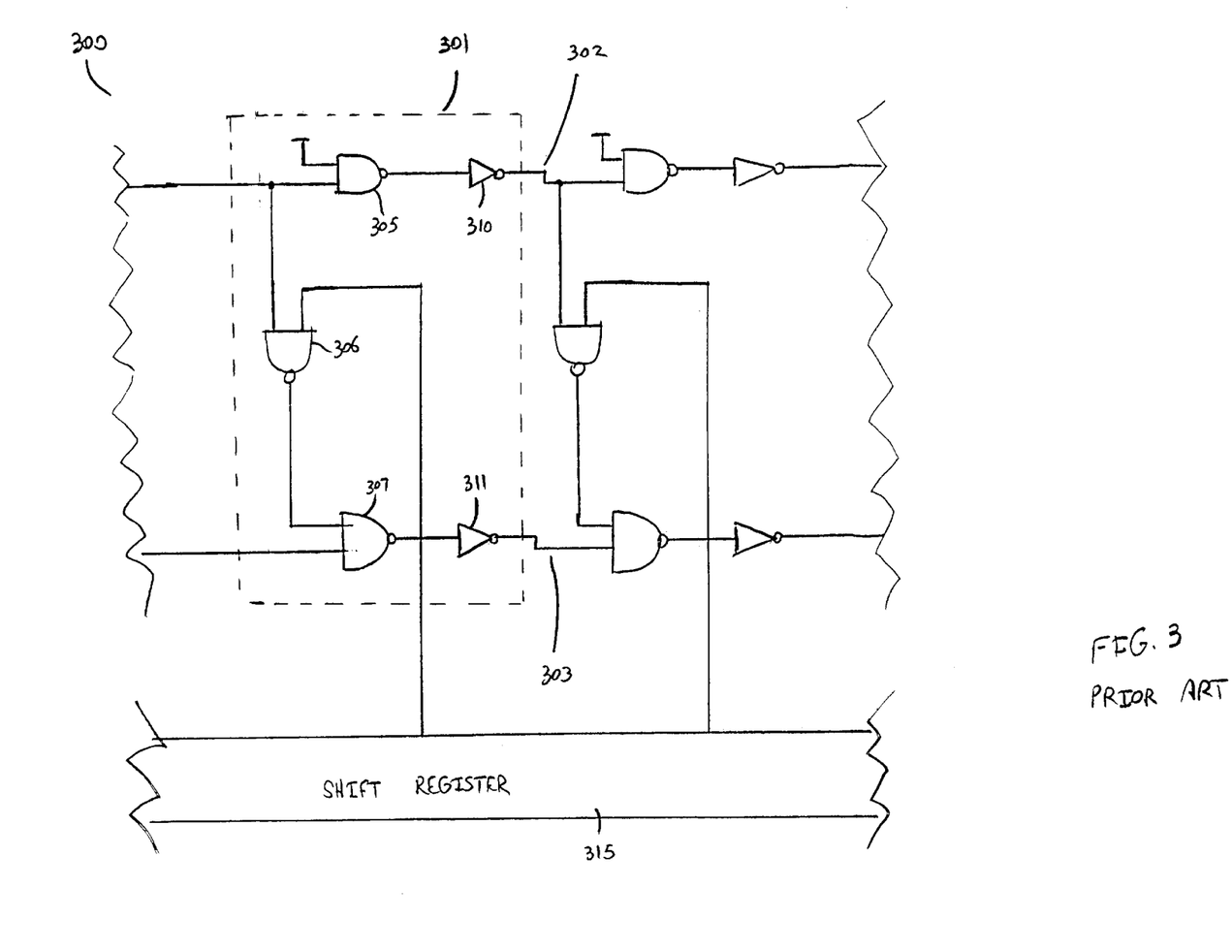
FIG. 3 illustrates in schematic diagram form a conventional delay line used in a DDLL.

A schematic diagram of a conventional Vernier Delay Line (VDL) circuit 300 used for the stages of delay line 101 of FIG. 1 is shown in FIG. 3. The circuit 300 of FIG. 3 consists of a series of n delay stages, each stage consisting of three NAND gates 305, 306 and 307 and two inverters 310, 311. The unit delay for stage 301 of upper delay line 302 consists of NAND gate 305 and inverter 310. The upper delay line 302 and tower delay line 303 are connected through NAND switch 306 whose transistor gates become the load for the upper delay line 302. Shift register 315 provides a signal to open or close NAND switch 306. The delay of the upper delay line 302 slightly exceeds that of the lower delay line 303. This delay difference becomes the unit delay time of the VDL circuit 300.

Figure 3A:
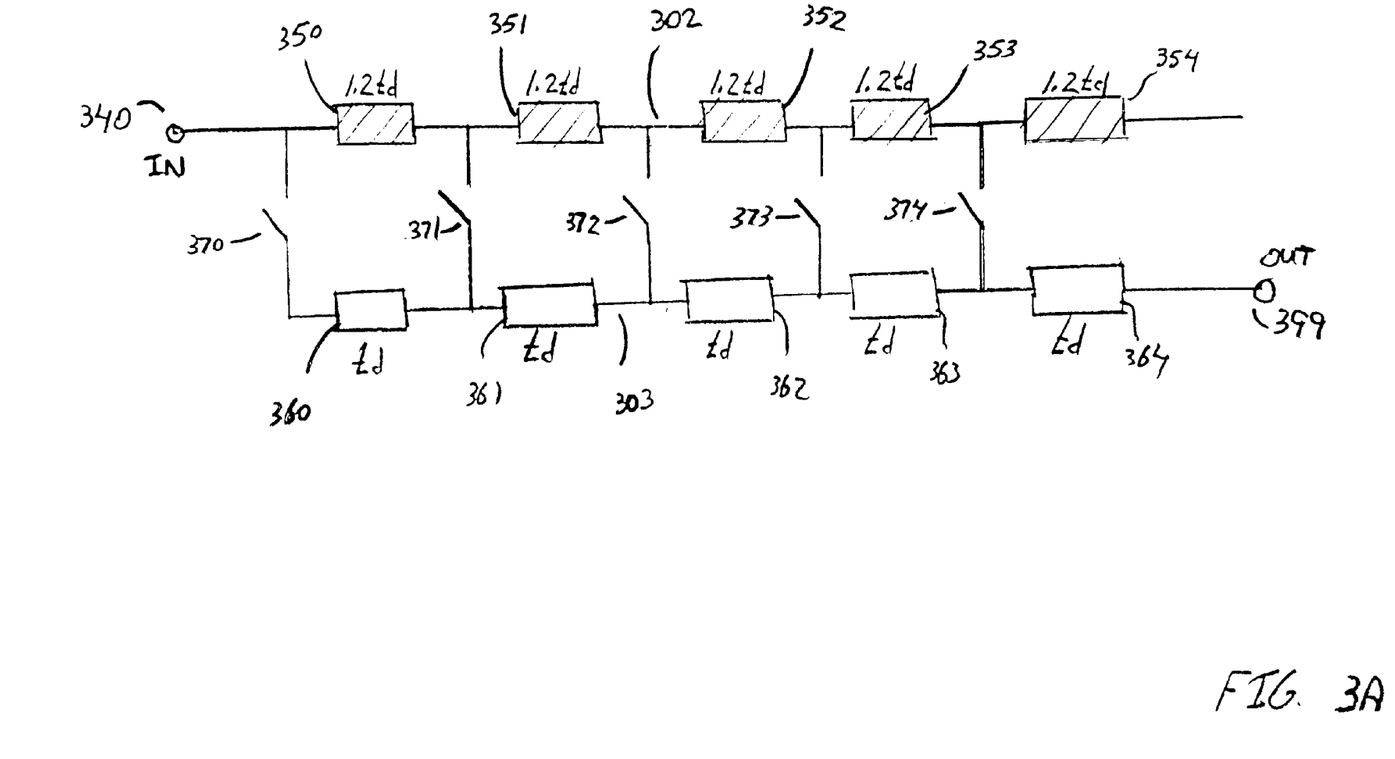
FIG. 3A illustrates in block diagram form the operation of the conventional delay line of FIG. 3.

FIG. 3A illustrates in block diagram form the functioning of the VDL circuit 300 of FIG. 3. Each unit delay 350, 351, 352, 353, 354 in upper delay line 302 has a delay time of 1.2 td, and each unit delay 360, 361, 362, 363, 364 in lower delay line 303 has a delay time of td, where td is the unit delay time of the conventional delay generator. The additional 0.2 td delay of the upper delay line in this example is due to the gate loading from the NAND switches. These unit delays 350–354 and 360–364 are serially connected through switches 370, 371, 372, 373, and 374. If only switch 370 closes, the VDL generates a delay of 5 td from IN node 340 to OUT node 399. Similarly, if switch 371 closes, the VDL generates a delay time of 5.2 td from IN node 340 to OUT node 399. Thus, the VDL circuit 300 is capable of generating a delay of every 0.2 td delay time.

Conventional delay lines of DDLLs, however, suffer from numerous drawbacks. One such drawback is that the resolution, i.e., the delay per stage, of the delay line is dependent upon the number of gates for each unit delay of the stage. The larger the number of gates in each unit delay, the larger the unit delay time td. Although the circuit shown in FIG. 3 can generate a delay of every 0.2 td, the resolution is limited by the value of td. The larger the value of td, the lower the resolution possible.

In addition to providing poor resolution, a high value for the unit delay time td can cause problems when the DDLL is placed in a state of minimum delay. A state of minimum delay occurs when the delay between the input and output clock signals is as close to zero as allowed by the parameters of the delay line, i.e., the smallest delay as allowed by the unit delay time td. In this case, if the DDLL attempts to decrease the delay, such decrease would be impossible because the delay line is already at minimum delay. Each unit delay of the delay line shown in FIG. 3 consists of one NAND gate and one inverter. The unit delay time for each unit delay having this construction is approximately 200–300 picoseconds. The minimal delay of the delay line 300 is thus limited to 200–300 picoseconds, without the possibility of decreasing the unit delay time below that time. Thus, the resolution of the delay line, determined by the unit delay time, is limited by the number of gates in each unit delay.

A further drawback of conventional DDLL circuits is the space required to layout the circuitry of the DDLLs. Each stage of the delay line consists of three NAND gates and two inverters for a total of five gates. Each stage could be replicated 50–100 times to target a typical clock input frequency of 100 MHz. This extensive amount of circuitry occupies a significant amount of space within a semiconductor circuit.

Figure 5A:
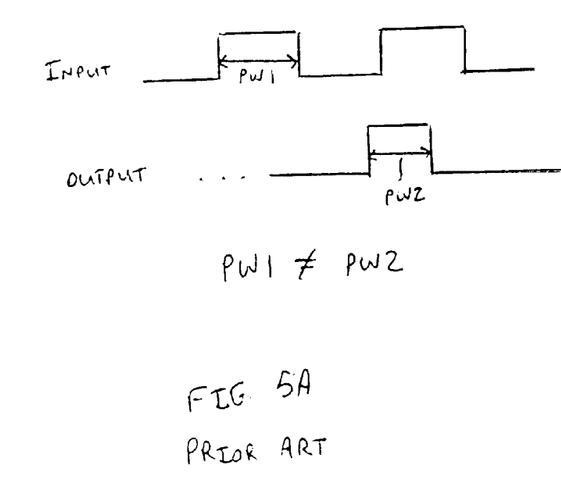
FIG. 5A illustrates a timing chart showing the difference between the pulse width of the input and output signals of the logic delay elements shown in FIG. 3.

Yet another drawback of conventional DDLL circuits is that they are inherently inaccurate due to asymmetries in the delay line design. Each stage of the delay line consists of three NAND gates and two inverters. Unless the pull-up and pull-down times of the transistors forming the inverters and NANDs in each delay element are identical, the output of the delay line will consist of pulses with asymmetrical rising and falling edges as compared to the input signal. This asymmetry leads to differing pulse widths between the input signal and the output signal, as shown in FIG. 5A. The output signal, therefore, will differ in pulse width from the input signal, which may lead to inaccuracies.

There is a need, therefore, to improve the performance of the delay line in a DDLL circuits by increasing the resolution of the delay line. Additionally, there is a need for improving the configuration of the delay line in DDLL circuits to reduce the amount of space required for the circuitry used to implement the delay line.

SUMMARY OF THE INVENTION

The present invention provides a unique method and apparatus for improving the resolution of a delay line, while also substantially reducing the necessary circuitry and associated space required for layout by reducing the number of gates in each unit delay.

In accordance with the present invention, the gate count for each unit delay is reduced to one gate. Since the number of gates for each unit delay is minimal, the unit delay time is decreased to a minimum, improving the resolution of the delay line.

Furthermore, by reducing the number of gates for each stage of the delay line to a total of three gates (two NAND gates and one inverter), the delay line will occupy approximately 40% less of the area previously occupied by the conventional delay line.

Finally, by reducing the number of gates for each stage of the delay line to a total of three gates, the delay line will result in substantially symmetrical rising and falling edges of the output signal.

These and other advantages and features of the invention will become apparent from the following detailed description of the invention which is provided in connection with the accompanying drawings.

DETAILED DESCRIPTION OF THE PREFERRED EMBODIMENTS

The present invention will be described as set forth in the preferred embodiments illustrated in FIGS. 4–8. Other embodiments may be utilized and structural or logical changes may be made without departing from the scope of the present invention.

Figure 4:
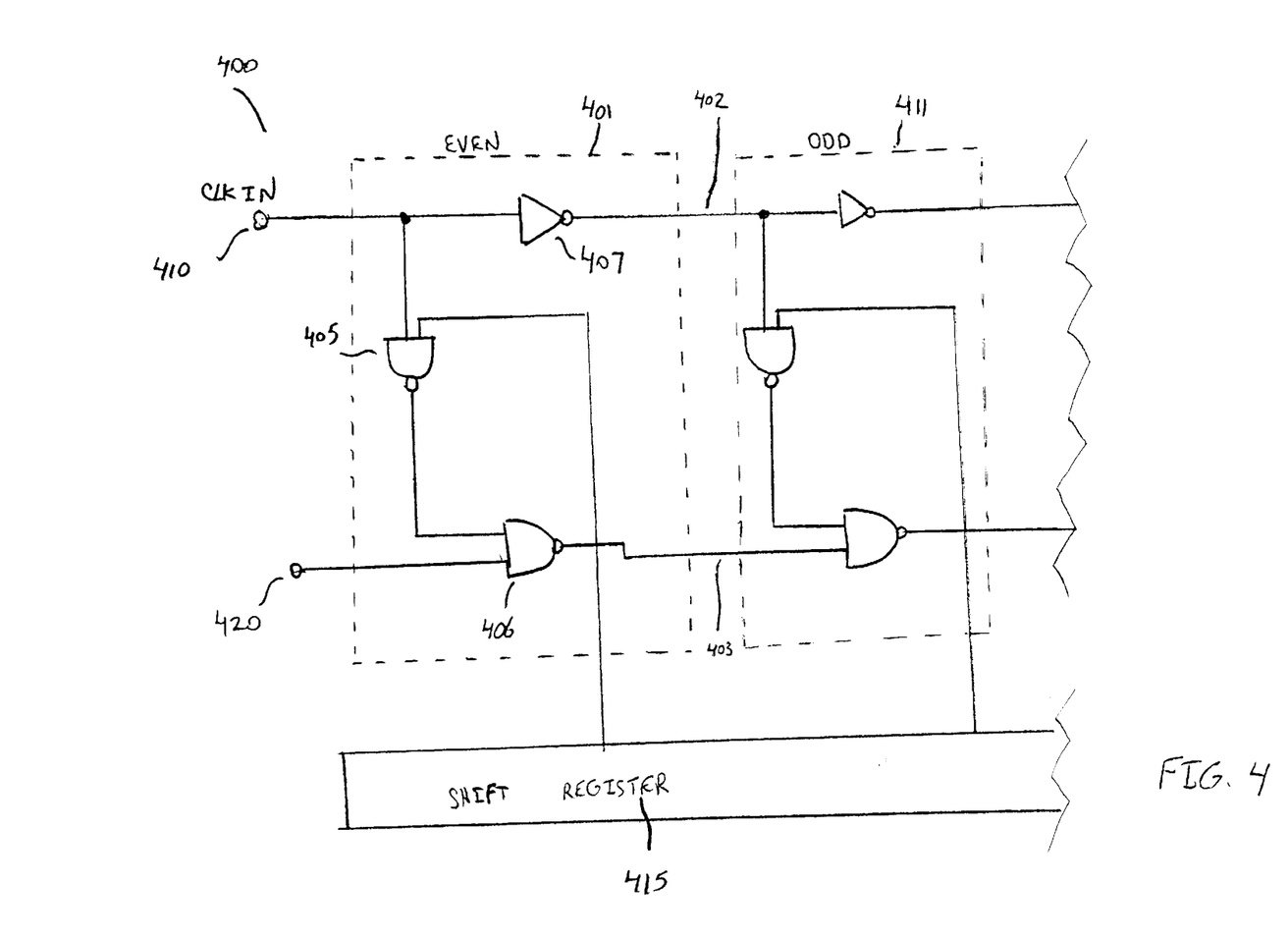
FIG. 4 illustrates in schematic diagram form a delay line in accordance with the present invention.

FIG. 4 illustrates in schematic diagram form a delay line circuit 400 in accordance with the present invention. A CLK IN signal is input at node 410. The delay circuit 400 of FIG. 4 consists of a series of n delay stages, each stage consisting of two NAND gates and one inverter. Each stage is either an odd stage or an even stage, depending upon its position in the line. Thus, the first stage 401 is an even stage, the second stage 411 is an odd stage, a third stage (not shown) would be an even stage, etc. Even stage 401 consists of NAND gates 405, 406 and inverter 407. NAND gate 405 acts as a switch connecting together upper delay line 402 and lower delay line 403. The transistor gates of NAND switch 405 become the load for the upper delay line 402. Shift register 415 provides a signal to open or close NAND switch 405. The delay of the lower delay line 403 slightly exceeds that of the upper delay line 402. This delay difference becomes the unit delay time of the delay line circuit 400.

By reducing the gate count of the unit delay to one gate, i.e. inverter 407, the unit delay time td is reduced to approximately 50 picoseconds. By reducing the unit delay time td, the resolution of each stage is increased.

Figure 4A:
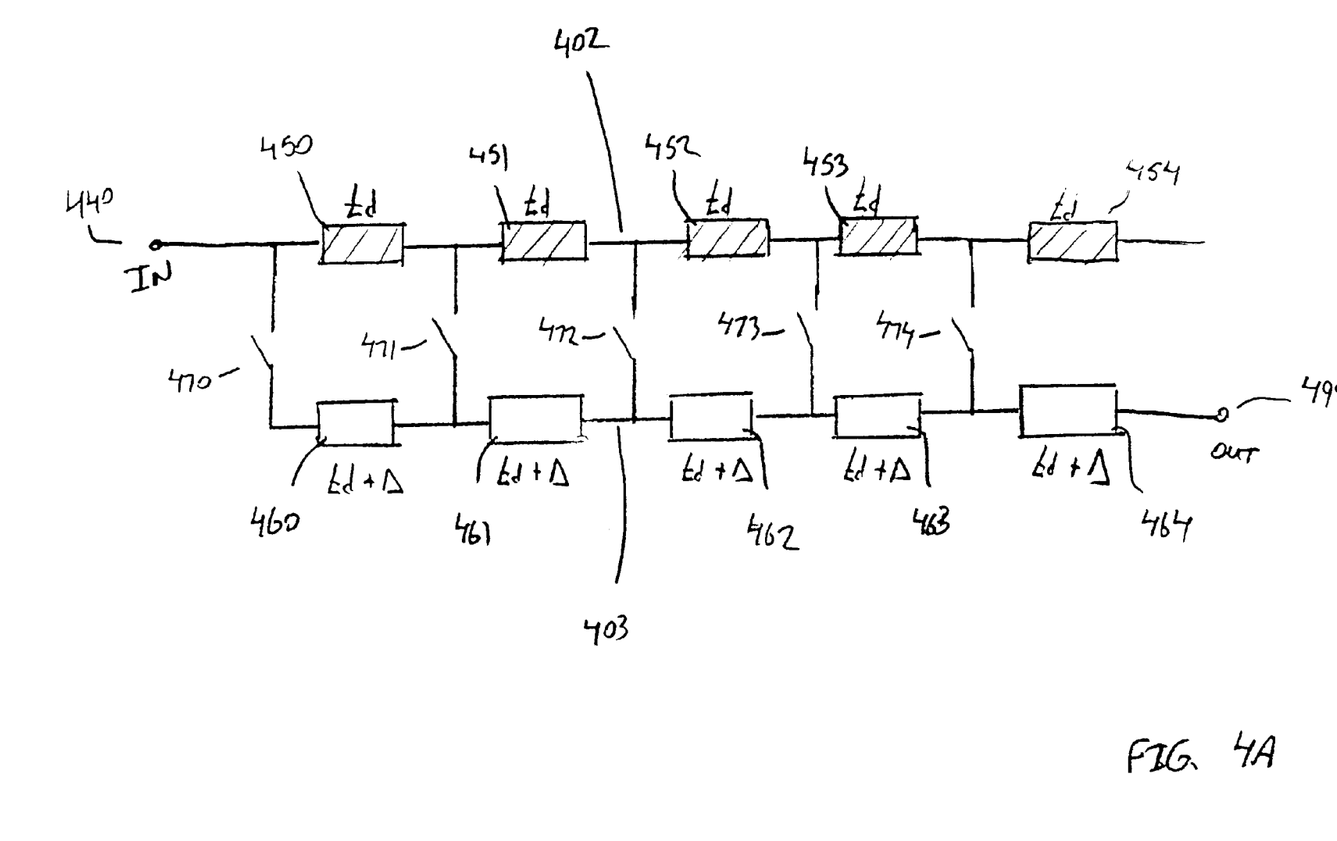
FIG. 4A illustrates in block diagram form the operation of the conventional delay line of FIG. 4.

FIG. 4A illustrates in block diagram form the functioning of the circuit 400 of FIG. 4. Each unit delay 450, 451, 452, 453, 454 in upper delay line 402 has a delay time of td, and each unit delay 460, 461, 462, 463, 464 in lower delay line 403 has a delay time of td+Δ, where td is the unit delay time of the delay generator. These unit delays 450–454 and 460–464 are serially connected through switches 470, 471, 472, 473, and 474. If only switch 470 closes, the circuit generates a delay of 5(td+Δ) from IN node 440 to OUT node 499. Similarly, if switch 471 closes, the circuit generates a delay of td+4(td+Δ) from IN node 440 to OUT node 499. Since the unit time delay of the circuit 400 is now 50 picoseconds as compared to the prior art of 200–300 picoseconds, the resolution of the delay time is significantly increased.

Figure 5B:
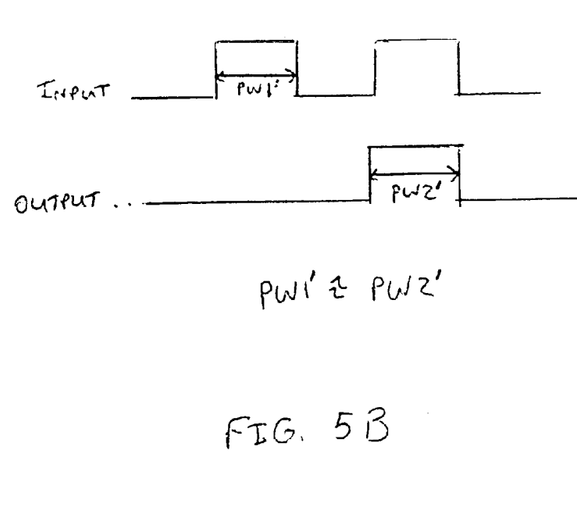
FIG. 5B illustrates a timing chart showing the difference between the pulse width of the input and output signals of the logic circuit delay elements shown FIG. 4.

Another aspect of the structure of delay stage 401 of delay circuit 400 is that because of the relatively low number of gates, it provides substantially symmetrical pulse widths for the input signal and output signal. This is depicted in FIG. 5B, where PW1' is very close to PW2'. This is a significant advantage over the prior art shown in FIG. 3, where each delay stage consists of five gates. Because the transistors forming the inverters and the NAND gates in each delay element do not have identical rise and decay times, the signal at the output of the prior art delay line circuit 300 has asymmetrical rising and falling edges as compared to the input signal. The output signal will therefore differ in pulse width from the input signal, leading to inaccuracies.

A further aspect of the structure of delay line circuit 400 is the significant reduction in the amount 6f gates necessary to implement the delay line. Each stage of the delay line circuit 400 consists of a total of three gates, i.e. two NANDs and one inverter. Each stage of the prior art line delay circuit 300 consists of five total gates, i.e. three NANDs and two inverters. The reduction of the total number of gates from five to three by the present invention allows the delay line circuit 400 to occupy approximately 40% less space than the prior art circuit 300. This results in significant savings when each stage is replicated 50–100 times to target a clock input frequency of 100 MHz.

In order to implement the delay line circuit 400 into a DDLL, it is necessary to precharge the first stage of the delay line by toggling the first stage input at node 420 between a high logic level, i.e. "1", and a low logic level, i.e. "0", for every cycle that a new switch is enabled over the previous cycle. When the switch selected is an even switch, node 420 must be precharged to a logic high level, i.e. "1." When the switch selected is an odd switch, node 240 must be precharged to a logic low level, i.e. "1".

Figure 6:
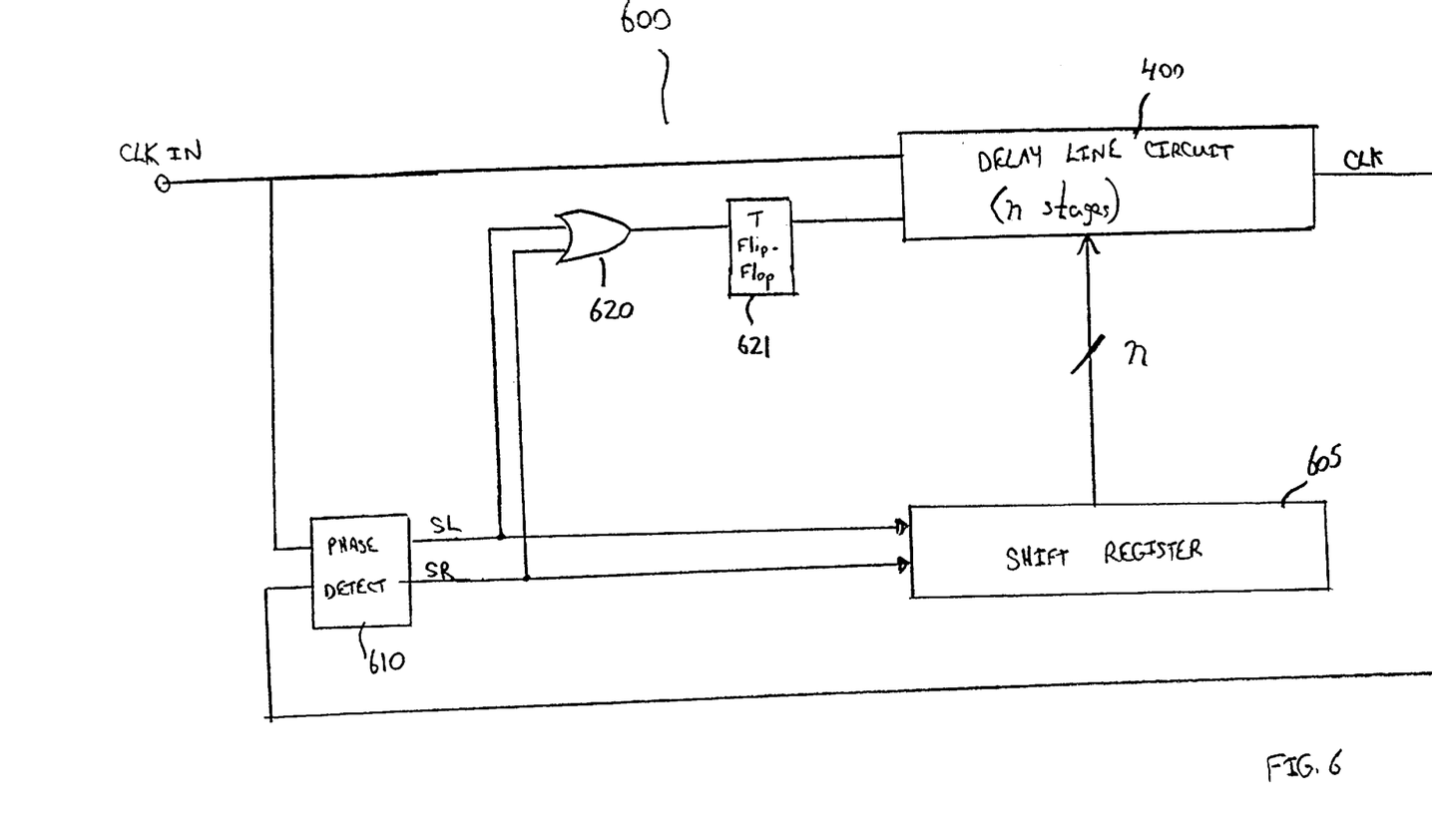
FIG. 6 is a block diagram showing an implementation of the precharge of the first stage of the delay line of FIG. 4.

FIG. 6 illustrates in block diagram form a DDLL circuit 600 which uses the delay line circuit 400 in accordance with the present invention. DDLL circuit 600 consists of delay line circuit 400, shift register 605, phase detect 610, and control circuitry to perform the necessary precharging of the first stage of delay line circuit 400, which consists of a gate 620, which can be either an OR gate as shown or an exclusive OR (XOR) gate, and T flip-flop 621.

The precharging is done in the following manner. The shift left (SL) and shift right (SR) signals sent from the phase detect circuit 610 to shift register 605 are input into the gate 620. The output of gate 620 is input into T Flip-flop 621. The output of T Flip-flop 621 is connected to node 420 of delay line circuit 400. T Flip-flop 621 will maintain its binary state, i.e. either a "0" or a "1" until directed by the input signal from gate 620 to switch states. In order to select a new switch in delay line circuit 400, phase detect 610 will send a signal to shift register 605, indicating either a shift left (SL) or shift right (SR) depending upon the shift required to synchronize the clock pulses. The signals on the SL and SR lines are input into the gate 620. If either of the output lines from the phase detect circuit goes high, indicating a shift is required and a new switch is being chosen, the output of gate 620 will cause the T Flip-flop 621 to change states, i.e. toggle. If no shift is necessary, a new switch need not be selected, and T Flip-flop will not toggle. Thus, the appropriate signal will be applied to the input node 420 of delay line circuit 400.

Figure 7:
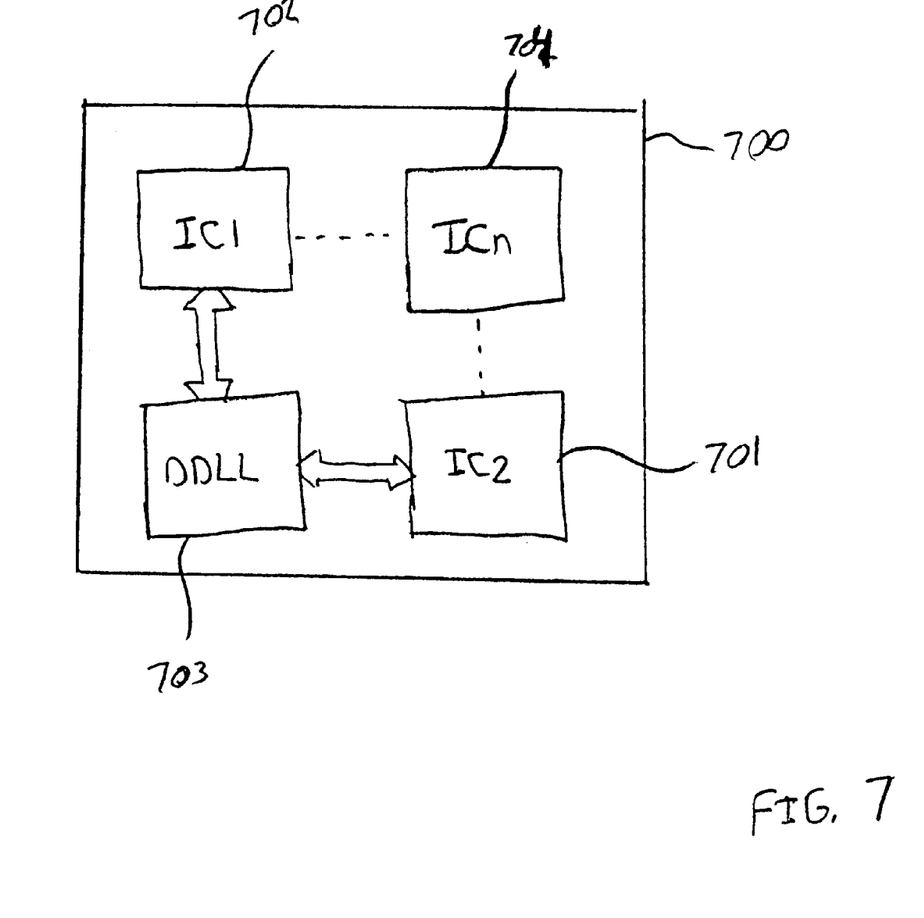
FIG. 7 is a block diagram of a printed circuit board (PCB) implementing the DDLL of the present invention.

FIG. 7 shows printed circuit board (PCB) 700 with multiple ICs 701, 702, 704 having differences in the phases of the IC generated internal clocks. DDLL 703 operates to align the phases of the internally generated clock signals of ICs 701 and 702 utilizing a delay line according to the present invention. PCB 700 could be used in a computer system where one of ICs 701 and 702 is a microprocessor and the other is a memory device, a storage device controller, or an input/output device controller.

Figure 8:
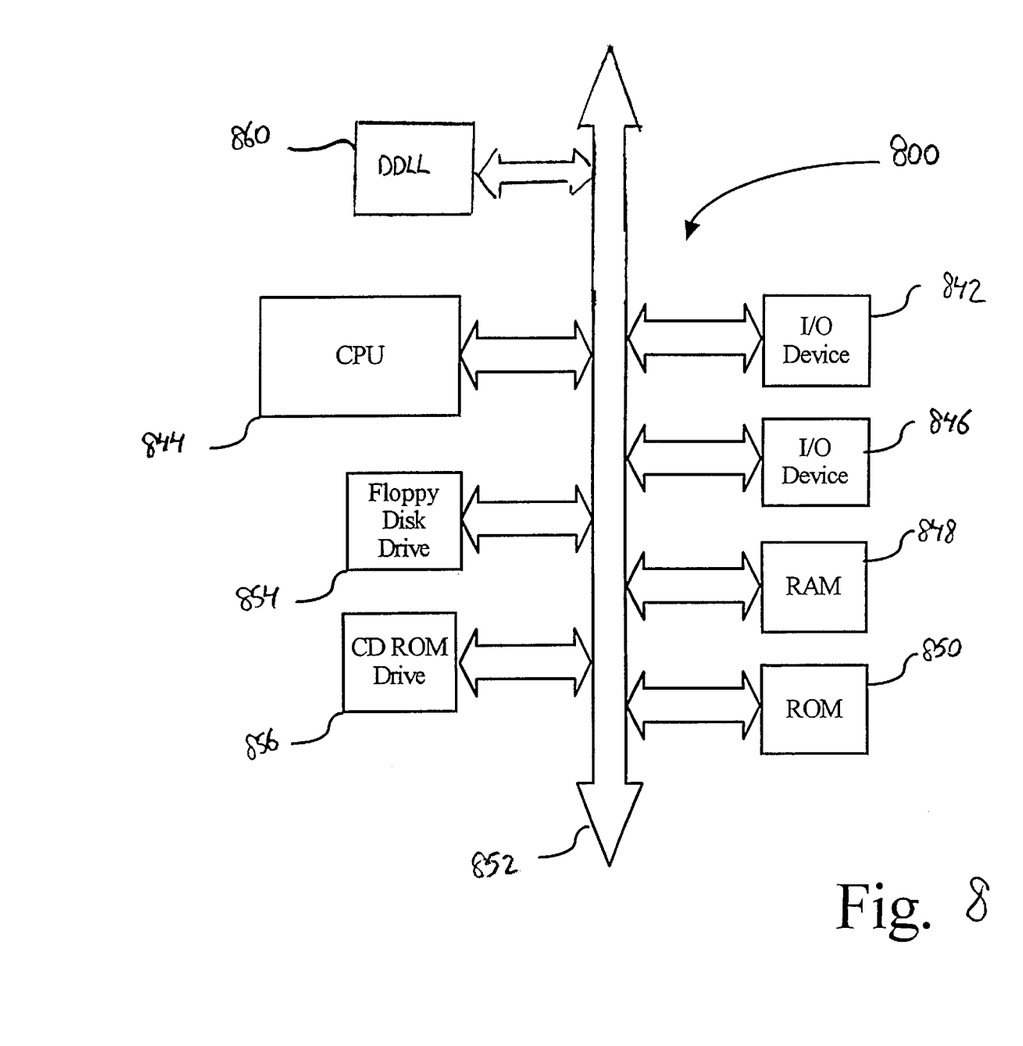
FIG. 8 is a block diagram of a computer system implementing the present invention.

A typical processor system which includes a DDLL according to the present invention is illustrated generally at 800 in FIG. 8. A computer system is exemplary of a device having digital circuits which require synchronization of the components in the system. Other types of dedicated processing systems, e.g. radio systems, television systems, GPS receiver systems, telephones and telephone systems also contain electronic circuits which can utilize the present invention.

A processor system, such as a computer system, generally comprises a central processing unit (CPU) 844 that communicates to an input/output (I/O) device 842 over a bus 852. A second I/O device 846 is illustrated, but may not be necessary depending upon the system requirements. The computer system 800 also includes random access memory (RAM) 848, read only memory (ROM) 850, and may include peripheral devices such as a floppy disk drive 854 and a compact disk (CD) ROM drive 856 which also communicate with CPU 844 over the bus 852. A DDLL circuit 860 in accordance with the present invention as described with respect to FIG. 6 is included in the system.

Utilizing the method of the present invention, the phases of the internally generated clock signals of the ICs in each of the devices can be aligned. It must be noted that the exact architecture of the computer system 800 is not important and that any combination of computer compatible devices may be incorporated into the system.

Reference has been made to preferred embodiments in describing the invention. However, additions, deletions, substitutions, or other modifications which would fall within the scope of the invention defined in the claims may be found by those skilled in the art and familiar with the disclosure of the invention. Any modifications coming within the spirit and scope of the following claims are to be considered part of the present invention.

What is claimed as new and desired to be protected by Letters Patent of the United States is:

1. A processor system comprising:
   a plurality of integrated circuits at least one of which is a microprocessor, each of said integrated circuits requiring a clock signal; and
   at least one digital delay locked loop circuit for synchronizing the required clock signals for said integrated circuits, said digital delay locked loop circuit comprising:
      a delay line for receiving an input signal and providing a delayed output signal a predetermined time after said input signal;
      a phase detect circuit for comparing the phases of the delayed output signal and the input signal and generating a first phase detect signal and a second phase detect signal related to the difference in phase between said input and delayed output signals;
      a shift register connected to said phase detect circuit for controlling a delay of said delay line proportional to said first and second phase detect signals; and
      control circuitry coupled to said first and said second phase detect signals to provide a precharge signal to said delay line,
      wherein said delay line comprises at least one delay stage, each of said delay stages comprising:
         a first logic circuit coupled to a stage input signal;

a second logic circuit coupled to a second stage input signal, wherein said second logic circuit is a NAND gate; and a switch coupled between said stage input signal and said second logic circuit, whereby a control signal will cause said switch to open or close to determine a path of said input signal, thereby controlling said predetermined time after said input signal.

2. The processor system according to claim 1, wherein said second stage input signal for a first of said at least one delay stages is said precharge signal.

3. The processor system according to claim 2, wherein said second stage input signal for a delay stage other than said first delay stage is an output from a preceding delay stage.

4. The processor system according to claim 1, wherein said first logic circuit is an inverter.

5. The processor system according to claim 1, wherein a unit delay time for each of said at least one delay stage is approximately 50 picoseconds.

6. The processor system according to claim 1, wherein said control signal is provided by the shift register.

7. A processor system comprising:

a plurality of integrated circuits at least one of which is a microprocessor, each of said integrated circuits requiring a clock signal; and at least one digital delay locked loop circuit for synchronizing the required clock signals for said integrated circuits, said digital delay locked loop circuit comprising:

a delay line for receiving an input signal and providing a delayed output signal a predetermined time after said input signal, wherein said delay line comprises at least one delay stage, each of said delay stages comprising:

a first logic circuit coupled to a stage input signal;

a second logic circuit coupled to a second stage input signal, wherein said second stage input signal for a first of said at least one delay stages is a precharge signal; and a switch coupled between said stage input signal and said second logic circuit, whereby a control signal will cause said switch to open or close to determine a path of said input signal, thereby controlling said predetermined time after said input signal;

a phase detect circuit for comparing the phases of the delayed output signal and the input signal and generating a first phase detect signal and a second phase detect signal related to the difference in phase between said input and delayed output signals;

a shift register connected to said phase detect circuit for controlling a delay of said delay line proportional to said first and second phase detect signals; and a control circuitry comprising a third logic circuit coupled to said first and said second phase detect signals; and a fourth logic circuit coupled to an output of said third logic circuit and said delay line, whereby said fourth logic circuit toggles said precharge signal between a first logic level and a second logic level according to said first and said second phase detect signals, said control circuitry coupled to said first and said second phase detect signals to provide said precharge signal to said delay line.

8. The processor system according to claim 7, wherein said fourth logic circuit is a flip-flop.

9. The processor system according to claim 7, wherein said third logic circuit is an OR gate.

10. The processor system according to claim 7, wherein said third logic circuit is an exclusive OR gate.

11. A processor system comprising:

a plurality of integrated circuits at least one of which is a microprocessor, each of said integrated circuits requiring a clock signal; and at least one digital delay locked loop circuit for synchronizing the required clock signals for said integrated circuits, said digital delay locked loop circuit comprising:

a delay line for receiving an input signal and providing a delayed output signal a predetermined time after said input signal;

a phase detect circuit for comparing the phases of the delayed output signal and the input signal and generating a first phase detect signal and a second phase detect signal related to the difference in phase between said input and delayed output signals;

a shift register connected to said phase detect circuit for controlling a delay of said delay line proportional to said first and second phase detect signals; and control circuitry coupled to said first and said second phase detect signals to provide a precharge signal to said delay line, wherein said delay line comprises at least one delay stage, each of said delay stages comprising:

a first logic circuit coupled to a stage input signal;

a second logic circuit coupled to a second stage input signal; and a switch coupled between said stage input signal and said second logic circuit, wherein said switch is a NAND gate;

whereby a control signal will cause said switch to open or close to determine a path of said input signal, thereby controlling said predetermined time after said input signal.

12. A printed circuit board comprising:

a plurality of integrated circuits at least one of which is a microprocessor, each of said integrated circuits requiring a clock signal; and at least one digital delay locked loop circuit for synchronizing the required clock signals for said integrated circuits, said digital delay locked loop circuit comprising:

a delay line for receiving an input signal and providing a delayed output signal a predetermined time after said input signal;

a phase detect circuit for comparing the phases of the delayed output signal and the input signal and generating a first phase detect signal and a second phase detect signal related to the difference in phase between said input and delayed output signals;

a shift register connected to said phase detect circuit for controlling a delay of said delay line proportional to said first and second phase detect signals; and control circuitry coupled to said first and said second phase detect signals to provide a precharge signal to said delay line, wherein said delay line comprises at least one delay stage, each of said delay stages comprising:

a first logic circuit coupled to a stage input signal;

a second logic circuit coupled to a second stage input signal, wherein said second logic circuit is a NAND gate; and a switch coupled between said stage input signal and said second logic circuit, whereby a control signal will cause said switch to open or close to determine a path of said input signal, thereby controlling said predetermined time after said input signal.

13. The printed circuit board according to claim 12, wherein said second stage input signal for a first of said at least one delay stages is said precharge signal.

14. The printed circuit board according to claim 13, wherein said second stage input signal for a delay stage other than said first delay stage is an output from a preceding delay stage.

15. The printed circuit according to claim 12, wherein said first logic circuit is an inverter.

16. The printed circuit board according to claim 12, wherein a unit delay time for each of said at least one delay stage is approximately 50 picoseconds.

17. The printed circuit board according to claim 12, wherein said control signal is provided by the shift register.

18. A printed circuit board comprising:

a plurality of integrated circuits at least one of which is a microprocessor, each of said integrated circuits requiring a clock signal; and at least one digital delay locked loop circuit for synchronizing the required clock signals for said integrated circuits, said digital delay locked loop circuit comprising:

a delay line for receiving an input signal and providing a delayed output signal a predetermined time after said input signal, wherein said delay line comprises at least one delay stage, each of said delay stages comprising:

a first logic circuit coupled to a stage input signal;

a second logic circuit coupled to a second stage input signal, wherein said second stage input signal for a first of said at least one delay stages is a precharge signal; and a switch coupled between said stage input signal and said second logic circuit, whereby a control signal will cause said switch to open or close to determine a path of said input signal, thereby controlling said predetermined time after said input signal;

a phase detect circuit for comparing the phases of the delayed output signal and the input signal and generating a first phase detect signal and a second phase detect signal related to the difference in phase between said input and delayed output signals;

a shift register connected to said phase detect circuit for controlling a delay of said delay line proportional to said first and second phase detect signals; and a control circuitry comprising a third logic circuit coupled to said first and said second phase detect signals; and a fourth logic circuit coupled to an output of said third logic circuit and said delay line, whereby said fourth logic circuit toggles said precharge signal between a first logic level arid a second logic level according to said first and said second phase detect signals, said control circuitry coupled to said first and said second phase detect signals to provide said precharge signal to said delay line.

19. The printed circuit board according to claim 18, wherein said fourth logic circuit is a flip-flop.

20. The printed circuit board according to claim 18, wherein said third logic circuit is an OR gate.

21. The printed circuit board according to claim 18, wherein said third logic circuit is an exclusive OR gate.

22. A printed circuit board comprising:

a plurality of integrated circuits at least one of which is a microprocessor, each of said integrated circuits requiring a clock signal; and at least one digital delay locked loop circuit for synchronizing the required clock signals for said integrated circuits, said digital delay locked loop circuit comprising:

a delay line for receiving an input signal and providing a delayed output signal a predetermined time after said input signal;

a phase detect circuit for comparing the phases of the delayed output signal and the input signal and generating a first phase detect signal and a second phase detect signal related to the difference in phase between said input and delayed output signals;

a shift register connected to said phase detect circuit for controlling a delay of said delay line proportional to said first and second phase detect signals; and control circuitry coupled to said first and said second phase detect signals to provide a precharge signal to said delay line, wherein said delay line comprises at least one delay stage, each of said delay stages comprising:

a first logic circuit coupled to a stage input signal;

a second logic circuit coupled to a second stage input signal; and a switch coupled between said stage input signal and said second logic circuit, wherein said switch is a NAND gate;

whereby a control signal will cause said switch to open or close to determine a path of said input signal, thereby controlling said predetermined time after said input signal.

* * * * *